(12) United States Patent
Hasegawa et al.

(10) Patent No.: US 7,160,416 B2
(45) Date of Patent: Jan. 9, 2007

(54) SUBSTRATE TREATING APPARATUS

(75) Inventors: Koji Hasegawa, Horikawa-dori (JP);
Akira Morita, Horikawa-dori (JP);
Kenichiro Arai, Horikawa-dori (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 11/081,139

(22) Filed: Mar. 16, 2005

(65) Prior Publication Data

US 2005/0217793 A1 Oct. 6, 2005

(30) Foreign Application Priority Data

Mar. 30, 2004 (JP) ............... 2004-099668
Dec. 17, 2004 (JP) ............... 2004-365754

(51) Int. Cl.
*C23F 1/00* (2006.01)
*B08B 3/08* (2006.01)

(52) U.S. Cl. .................. 156/345.23; 134/135

(58) Field of Classification Search ............... 134/1.3, 134/113, 135, 138, 140, 153, 157, 200, 902; 156/345.11, 345.23, 345.55
See application file for complete search history.

(56) References Cited

U.S. PATENT DOCUMENTS 5,816,274 A * 10/1998 Bartram et al. ............. 134/140
6,513,537 B1 * 2/2003 Orii et al. .................... 134/1.2
6,767,840 B1 * 7/2004 Uehara et al. .............. 438/745
6,797,075 B1 * 9/2004 Ching et al. .................. 134/32
2002/0170571 A1 * 11/2002 Egashira et al. ............. 134/1.3
2004/0071531 A1 * 4/2004 Hiroe et al. ........... 414/222.04
2005/0039776 A1 * 2/2005 Yi et al. ......................... 134/2

FOREIGN PATENT DOCUMENTS

| JP | 8-215647 | 8/1996 |
|---|---|---|
| JP | 2000-235967 | 8/2000 |
| JP | 2003-059879 | 2/2003 |

* cited by examiner

*Primary Examiner*—Parviz Hassanzadeh
*Assistant Examiner*—Sylvia MacArthur
(74) *Attorney, Agent, or Firm*—Ostrolenk, Faber, Gerb & Soffen, LLP (57) ABSTRACT

A substrate treating apparatus for treating substrates as immersed in a treating solution includes a treating tank for storing the treating solution and accommodating the substrates, a holding mechanism for holding a plurality of substrates in upstanding posture in the treating tank, and a drive mechanism for revolving the holding mechanism about a virtual horizontal axis extending in a direction of alignment of the plurality of substrates. The plurality of substrates are treated, while the holding mechanism holding the plurality of substrates is immersed in the treating solution, and the drive mechanism is operated to revolve the plurality of substrates about the horizontal axis.

8 Claims, 4 Drawing Sheets

SUBSTRATE TREATING APPARATUS

BACKGROUND OF THE INVENTION (1) Field of the Invention

This invention relates to substrate treating apparatus for treating semiconductor wafers, glass substrates for liquid crystal displays and so on (hereinafter called simply substrates). More particularly, the invention relates to a technique for treating substrates as immersed in a treating solution stored in a treating tank.

(2) Description of the Related Art

Conventionally, this type of apparatus includes a treating tank for storing a treating solution, a holding mechanism movable into the treating tank while holding a plurality of substrates aligned in upstanding posture, and a rotating mechanism for rotating the holding mechanism about a virtual horizontal axis serving as the center of rotation extending in the direction of alignment of the substrates (see Japanese Unexamined Patent Publication No. 2003-59879, for example).

With this apparatus, a plurality of substrates are immersed along with the holding mechanism in the treating solution stored in the treating tank, and are treated for a predetermined time while being rotated about the virtual horizontal axis by the rotating mechanism. The apparatus is intended to treat the plurality of substrates uniformly by rotating the substrates for causing the treating solution to contact the entire surfaces of the substrates.

The conventional apparatus noted above has the following drawbacks.

With the conventional apparatus, since the plurality of substrates are rotated about a virtual horizontal axis serving as the center of rotation extending in the direction of alignment of the substrates, central portions of the substrates make very little movement although peripheral portions of the substrates move through extensive ranges. Consequently, the degree of contact with the treating solution differs greatly between the central portions and peripheral portions of the substrates. This poses a problem that the substrates cannot be treated uniformly over the entire surfaces thereof.

Since the central portions of the substrates are treated more slowly than the peripheral portions, the treatment is performed in a way adjusted to the central portions. This results in a drawback of requiring a long treating time.

SUMMARY OF THE INVENTION

This invention has been made having regard to the state of the art noted above, and its object is to provide a substrate treating apparatus having an improved substrate moving mode for treating substrates uniformly over entire surfaces thereof, and yet achieving a reduced treating time.

The above object is fulfilled, according to this invention, by a substrate treating apparatus for treating substrates as immersed in a treating solution, comprising a treating tank for storing the treating solution and accommodating the substrates, a holding mechanism for holding a plurality of substrates in upstanding posture in the treating tank, and a drive mechanism for revolving the holding mechanism about a virtual horizontal axis extending in a direction of alignment of the plurality of substrates, wherein the plurality of substrates are treated, while the holding mechanism holding the plurality of substrates is immersed in the treating solution, and the drive mechanism is operated to revolve the plurality of substrates about the horizontal axis.

According to this invention, when the drive mechanism is operated with the holding mechanism holding a plurality of substrates and immersed in the treating solution, the plurality of substrates revolve about the virtual horizontal axis in the treating tank. Since central portions as well as peripheral portions of the substrates make a circular motion, the treating solution can contact the substrates uniformly over the entire surfaces thereof. As a result, the substrates are treated uniformly over the entire surfaces thereof. Moreover, a reduced treating time may be achieved since the treatment need not be adjusted to portions where the treatment progresses slowly.

In another aspect of the invention, a substrate treating apparatus for treating substrates as immersed in a treating solution comprises a treating tank for storing the treating solution and accommodating the substrates, a holding mechanism for holding a plurality of substrates in upstanding posture in the treating tank, and a drive mechanism for revolving the holding mechanism about a virtual horizontal axis extending in a direction of alignment of the plurality of substrates, and at a predetermined distance from the virtual horizontal axis, wherein the plurality of substrates are treated, while the holding mechanism holding the plurality of substrates is immersed in the treating solution, and the drive mechanism is operated to revolve centers of the plurality of substrates about the horizontal axis.

With this construction, when the drive mechanism is operated with the holding mechanism holding a plurality of substrates and immersed in the treating solution, the centers of the plurality of substrates revolve about the virtual horizontal axis, and at a predetermined distance from the virtual horizontal axis, in the treating tank. Since the centers as well as peripheral portions of the substrates make a circular motion about the virtual horizontal axis, the treating solution can contact the substrates uniformly over the entire surfaces thereof. As a result, the substrates are treated uniformly over the entire surfaces thereof. Moreover, a reduced treating time may be achieved since the treatment need not be adjusted to portions where the treatment progresses slowly.

Preferably, the drive mechanism includes a rotary shaft disposed above the treating tank and extending along the direction of alignment of the plurality of substrates, a rotating mechanism for rotating the rotary shaft, pivot pieces arranged on the rotary shaft and extending from the rotary shaft, and connecting pieces each having one end thereof pivotably attached to a distal end of one of the pivot pieces, and having the other end attached to the holding mechanism.

When the rotating mechanism rotates the rotary shaft, the distal ends of the pivot pieces make a circular motion at a predetermined distance from the rotary shaft. Since one end of each connecting piece also make a corresponding circular motion, the holding mechanism fixed to the other end of each connecting piece revolves about the horizontal axis in the treating solution.

The apparatus, preferably, further comprises a lift mechanism for vertically moving the drive mechanism relative to the treating tank.

The lift mechanism lowers the drive mechanism in time of treatment, and raises the drive mechanism in non-treatment time. Thus, the holding mechanism is movable between a position in the treating tank and a position above the treating tank.

Preferably, the treating tank stores a treating solution containing potassium hydroxide.

The treating solution containing potassium hydroxide can etch the substrates themselves. Thus, a "back grinding" may be carried out to reduce the thickness of the substrates.

Preferably, the plurality of substrates immersed in the treating solution stored in the treating tank each have a surface on which a circuit is formed, which surface is coated with a material resistant to the treating solution.

The material resistant to the treating solution can protect the surface of each substrate where a circuit is formed.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

A preferred embodiment of this invention will be described in detail hereinafter with reference to the drawings.

Figure 1:
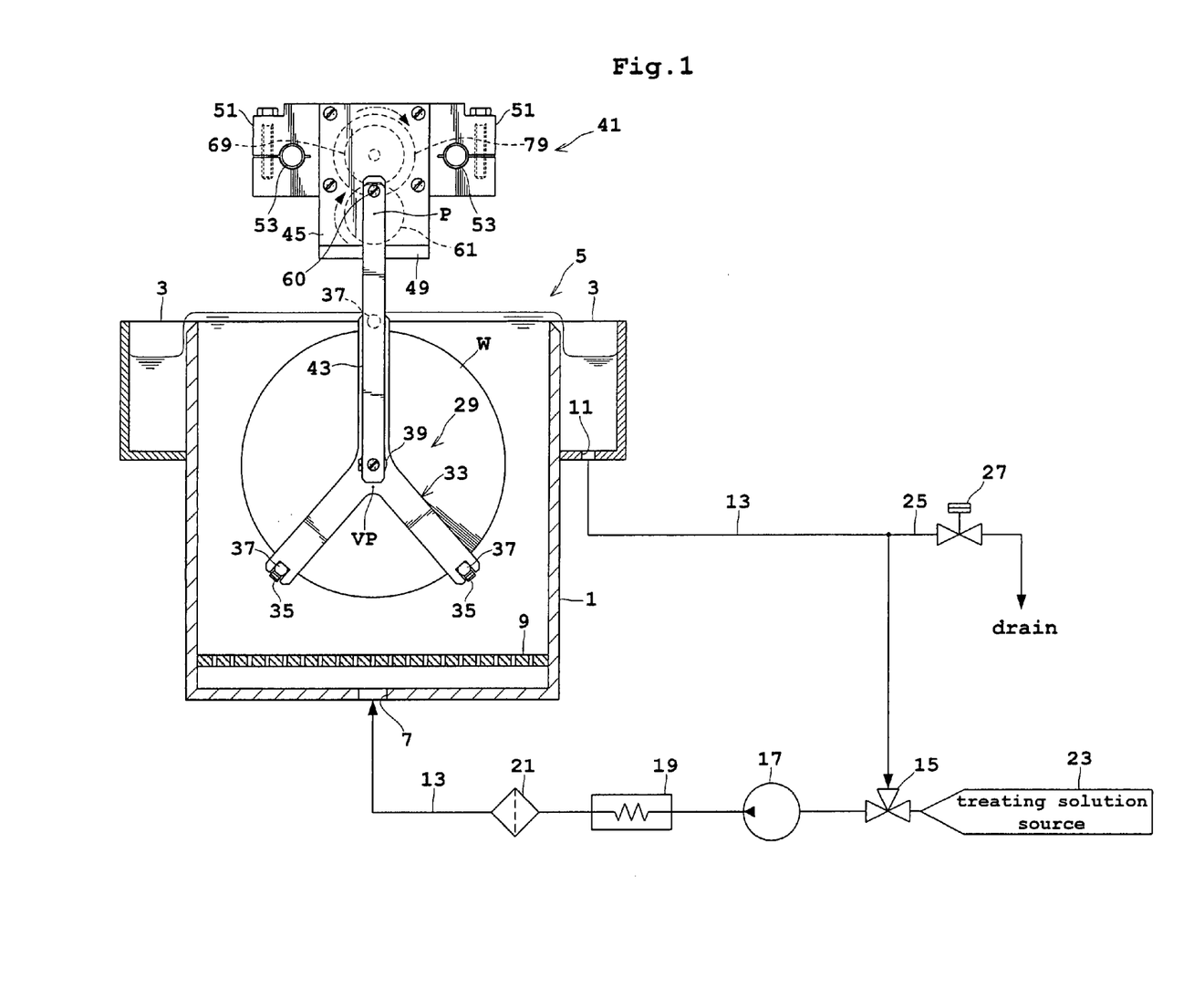
FIG. 1 is a front view in vertical section showing an outline of a substrate treating apparatus according to this invention.
Figure 2:
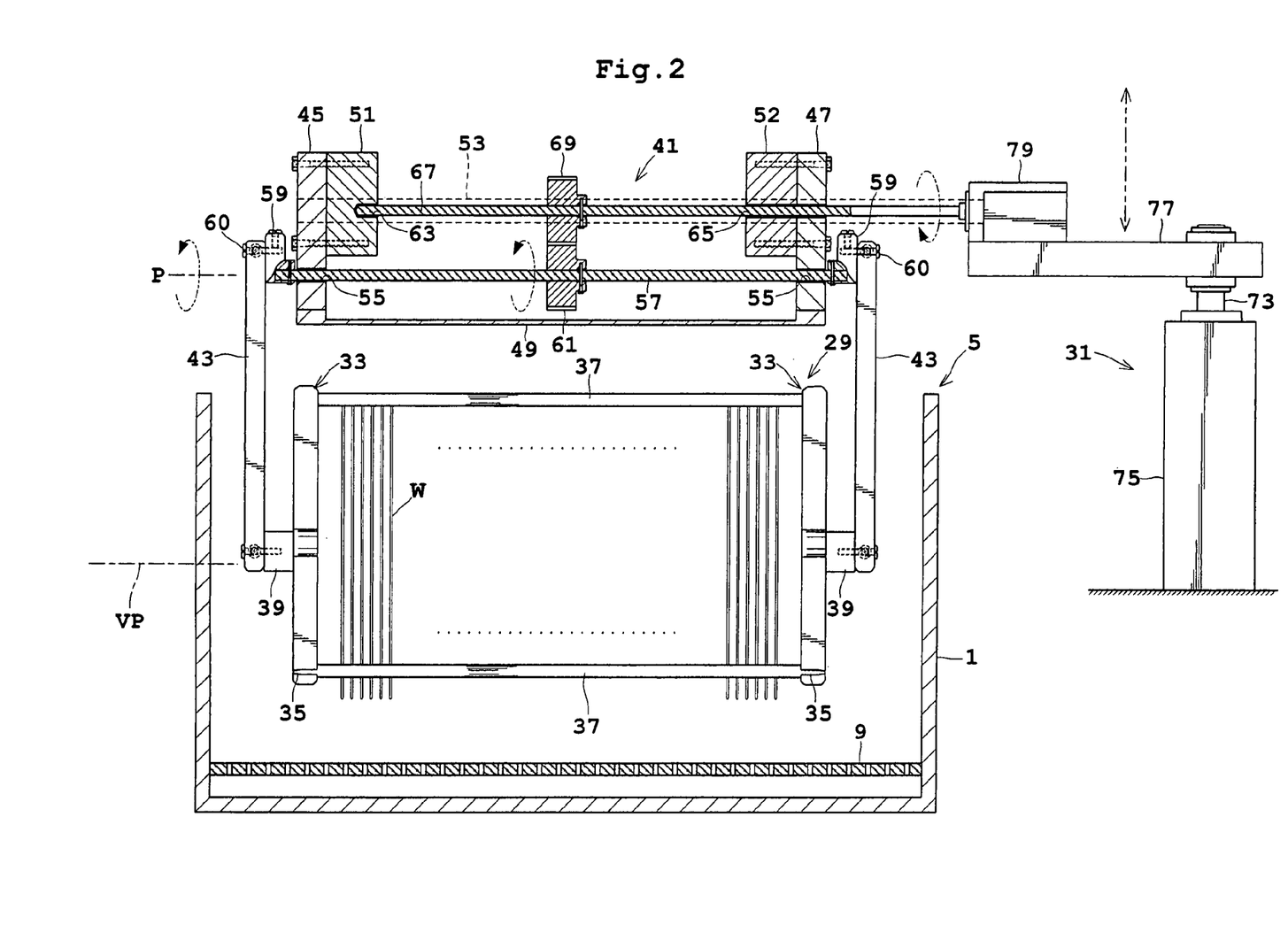
FIG. 2 is a side view in vertical section showing the outline of the substrate treating apparatus.

FIG. 1 is a front view in vertical section showing an outline of a substrate treating apparatus according to this invention. FIG. 2 is a side view in vertical section showing the outline of the substrate treating apparatus.

The substrate treating apparatus includes an inner tank 1 for storing a treating solution, and an outer tank 3 for collecting the treating solution overflowing the inner tank 1, the two tanks 1 and 3 constituting a treating tank 5. The inner tank 1 has a feed port 7 formed in the bottom thereof for introducing the treating solution, and a straightening plate 9 disposed above the feed port 7. The straightening plate 9 has a plurality of fine bores formed in the entire area thereof for straightening currents of the treating solution introduced from the feed port 7 into the inner tank 1, and directing the solution toward wafers W.

The outer tank 3 has a drain port 11 formed therein. The drain port 11 and feed port 7 are connected to supply piping 13. The supply piping 13 includes a three-way valve 15, a pump 17, an in-line heater 19 and a filter 21 arranged in order from upstream to downstream. The three-way valve 15 is connected also to a treating solution source 23. A branch pipe 25 is connected to the supply piping 13 between the drain port 11 and three-way valve 15. The branch pipe 25 has a switch valve 27 mounted thereon, which is operable to drain the treating solution collected in the outer tank 3.

In addition to the above construction, the apparatus includes a holding mechanism 29. This holding mechanism 29 is vertically movable by a lift mechanism 31 (FIG. 2) between a treating position shown in FIGS. and 2, and a standby position above the treating position and treating tank 5.

The holding mechanism 29 includes a pair of holding frames 33 having an inverted Y shape as seen from the front of wafers W (FIG. 1), mounting recesses 35 each formed in one of the distal ends of the holding frames 33, two engaging members 37 fixedly attached to the two lower mounting recesses 35 of each holding frame 33, and an engaging member 37 detachably attached to the upper mounting recess 35 of each holding frame 33. Each engaging member 37 defines a plurality of grooves, not shown, for engaging edges of wafers W. Each engaging member 37 is attached at opposite ends thereof to the front holding frame 33 and rear holding frame 33. The engaging members 37 engage a plurality of wafers W at three peripheral positions of each wafer W to steadily hold the plurality of wafers W.

Each of the front and rear holding frames 33 has a shaft 39 fixed to and projecting outward from a central portion thereof. The shaft 39 is connected to a connecting piece 43 depending from a drive mechanism 41 disposed above the treating tank 5. The connecting piece 43 is fixedly screwed at a lower end thereof to the shaft 39, and thus has a fixed position relative to the holding frame 33.

The drive mechanism 41 has a function for revolving the above holding mechanism 29 about a virtual horizontal axis VP extending in the direction of alignment of the wafers W in the inner tank 1. The drive mechanism 41 will be described in detail hereinafter.

The drive mechanism 41 includes a front frame 45, a rear frame 47, a reinforcing cover 49 for reinforcing these frames 45 and 47 in lower positions thereof, reinforcing frames 51 and 52 attached to the front frame 45 and rear frame 47, respectively, and reinforcing pipes 53 inserted into the front and rear reinforcing frames 51 and 52. The front frame 45 and rear frame 47 have shaft bores 55 formed in lower positions thereof. The shaft bores 55 support a first rotary shaft 57 having an axis P extending parallel to the direction of alignment of wafers W. The first rotary shaft 57 has opposite ends thereof projecting from the front frame 45 and rear frame 47. Pivot pieces 59 are fixedly screwed to the opposite ends of the first rotary shaft 57, which pieces 59 extend from the axis P in a direction parallel to the planes of wafers W. The upper end of each connecting piece 43 noted hereinbefore is attached by a screw 60 to the distal end of one of the pivot pieces 59 to be revolvable in a plane parallel to the planes of wafers W. The first rotary shaft 57 has a gear 61 fixedly mounted on an intermediate part thereof.

The reinforcing frame 51 has a receiving hole 63 formed in a rear wall thereof, while the reinforcing frame 52 has a through hole 65 formed therein. A second rotary shaft 67 has one end thereof inserted into the receiving hole 63, and the other end region extending through the through hole 65 to a position rearwardly of the treating tank 5. The second rotary shaft 67 has a gear 69 mounted thereon and meshed with the gear 61 on the first rotary shaft 57. The lift mechanism 31 is connected to the projecting end of the second rotary shaft 67.

The lift mechanism 31 includes an actuator 75 having an operating piece 73 extendible and contractible for vertically moving the holding mechanism 29 between the standby position and treating position, and a lift piece 77 extending from the upper end of the operating piece 73 toward the treating tank 5. A motor 79 is mounted on a portion of the lift piece 77 adjacent the treating tank 5, and has a rotary shaft connected to the other, projecting end of the second rotary shaft 67. The reinforcing pipes 53 noted hereinbefore are also attached to the lift piece 77.

When the rotary shaft of the motor 79 described above is driven clockwise as seen from the front, as shown in FIGS. 1 and 2, the second rotary shaft 67 rotates clockwise, which rotates the first rotary shaft 57 counterclockwise through the gears 69 and 61. Then, the pivot pieces 59 attached to the first rotary shaft 57 pivot counterclockwise, with the distal ends of the pivot pieces 57 revolving about the axis P. Consequently, the connecting pieces 43 rotatably attached to the distal ends of the pivot pieces 59, while maintaining the vertical posture, have the upper ends thereof revolving about the axis P. Then the holding mechanism 29 fixed to the lower ends of the connecting pieces 43 makes a revolving motion in the inner tank 1.

In other words, the pivot pieces 59 attached to the first rotary shaft 57 pivot counterclockwise, and the distal end of each pivot piece 59 moves in a circle around the axis P. The connecting pieces 43 attached to the distal ends of the pivot pieces 59, while maintaining the vertical posture, have the upper ends thereof also making a circular motion about the axis P. Thus, the holding mechanism 29 fixed to the lower ends of the connecting pieces 43 revolves about the virtual horizontal axis VP in the inner tank 1, describing a circle at a predetermined distance from the horizontal axis VP. As a result, the central portions of the wafers W held by the holding mechanism 29 revolve to describe a circle about the horizontal axis VP. The predetermined distance noted above is equal to the spacing between the axis P of the pivot pieces 59 and the screws 60.

Figure 3:
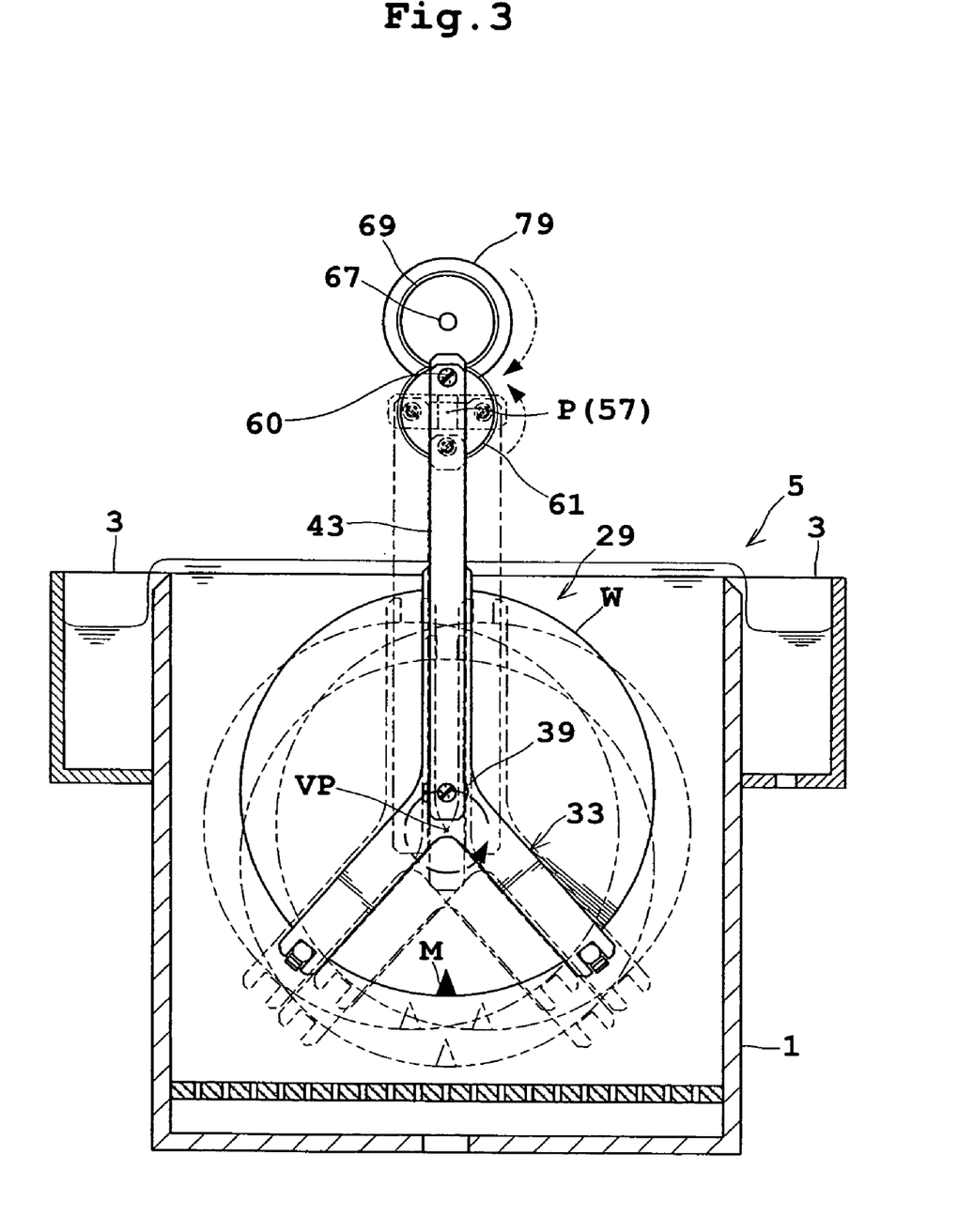
FIG. 3 is an explanatory view of operation of the apparatus.

Next, operation of the substrate treating apparatus having the above construction will be described with reference to FIGS. 1 through 3. FIG. 3 is an explanatory view of operation. In the following description, a back grinding (also called thinning or back polish) of wafers W is taken as an example of treatment. The back grinding is carried out to reduce the thickness of wafers W drastically by chemically grinding the back surfaces thereof with a treating solution such as a solution of potassium hydroxide (KOH). The surfaces of wafers W having a circuit formed thereon are coated with a material resistant to the treating solution beforehand. Such a material may be a chemical-resistant adhesive tape or wax, for example.

Initially, the actuator 75 is extended to maintain the holding mechanism 29 in the standby position, not shown, above the treating tank 5. In this state, a plurality of wafers W to be treated are transferred from a transport device, not shown, to the holding mechanism 29.

Next, the switch valve 27 is closed, the three-way valve 15 is switched to the treating solution source 23, and the pump 17 is operated to supply the treating solution. Further, the in-line heater 19 is operated to heat the treating solution to a predetermined temperature for circulation through the supply piping 13. The treating solution may be a solution of potassium hydroxide having a high etching rate for semiconductor silicon, for example. The treating solution supplied in this way overflows the inner tank 1 to be collected in the outer tank 3. Then, the three-way valve 15 is switched to stop the supply from the treating solution source 23 and circulate the treating solution from the outer tank 3 through the supply piping 13. When, in the course of the circulation, the temperature of the treating solution has stabilized as a result of heating by the in-line heater 19, the lift mechanism 31 is operated to lower the holding mechanism 29 from the standby position to the treating position. At the same time, the motor 79 is operated to revolve the holding mechanism 29. The number of revolutions of the holding mechanism 29 caused by the motor 79 is about 90 rpm, for example. This number of revolutions may be adjusted as appropriate according to the type of treatment.

In the above operation, a plurality of wafers W are immersed along with the holding mechanism 29 in the treating solution in the inner tank 1, to be treated with the treating solution. As shown in FIG. 3, the holding mechanism 29 is revolved by the operation of the motor 79, and the plurality of wafers W make a circular motion about the horizontal axis in the inner tank 1. Since central portions as well as peripheral portions of the wafers W make a circular motion, the treating solution can contact the wafers W uniformly over the entire surfaces thereof. As a result, the wafers W are treated uniformly over the entire surfaces thereof. Moreover, a reduced treating time may be achieved since the treatment need not be adjusted to portions where the treatment progresses slowly.

In other words, the motor 79 causes the holding mechanism 29 to revolve about the virtual horizontal axis VP, describing a circle at a predetermined distance from the horizontal axis VP. Thus, the central portions as well as the peripheral portions of the wafers W make a circular motion about the horizontal axis VP. The treating solution can thereby contact the wafers W uniformly over the entire surfaces thereof.

In FIG. 3, a wafer W is shown with a triangular mark M affixed to a lower position thereof to facilitate understanding of the mode of revolution of the wafers W. The mark M clarifies a locus described by the lower position of the wafer W in revolution, whereby the motion of the whole wafer W may be grasped easily.

Figure 4A:
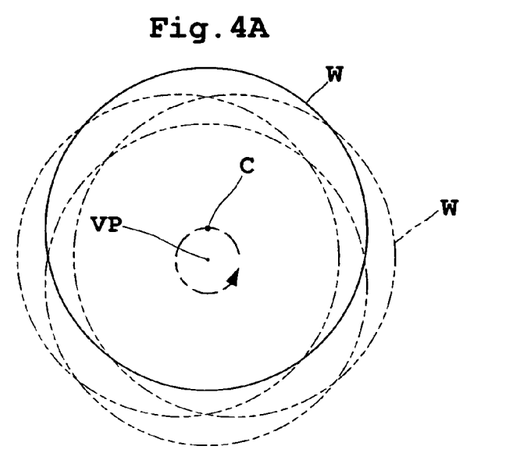
FIG. 4A is a view schematically showing a mode of rotation according to this invention.
Figure 4B:
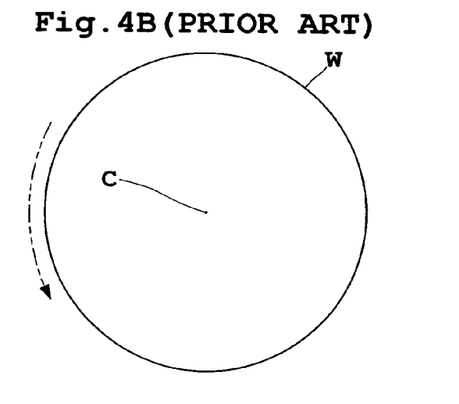
FIG. 4B is a view schematically showing a mode of rotation according to the prior art.
Figure 4C:
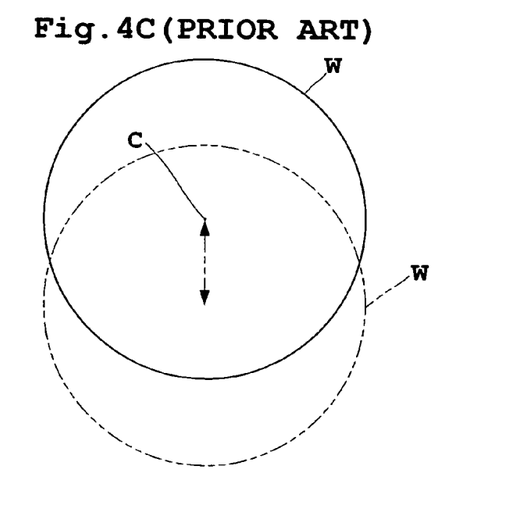
FIG. 4C is a view schematically showing a mode of vertical movement according to the prior art.

FIG. 4 schematically shows the above revolving motion and circular movement about the virtual horizontal axis VP. FIG. 4A shows the circular movement in the embodiment described above. FIG. 4B shows a rotation in the prior art. FIG. 4C schematically shows a vertical movement in the prior art.

In the above embodiment, as shown in FIG. 4A, the center C of each wafer W revolves to describe a circle about the horizontal axis VP, while the wafer W remaining in a fixed orientation. Thus, both the peripheral portions and center C of the wafer W make a circular motion in the treating solution.

With the rotation in the prior art, as shown in FIG. 4B, the center C of each wafer W is immovable although peripheral portions move greatly in a treating solution.

Although not cited herein as a conventional example, as shown in FIG. 4C, it is conceivable in the prior art to move wafers W vertically. With this construction, both the center C and peripheral portions are movable up and down whereby, compared with the above conventional example, the center C of each wafer W can contact the treating solution by a relatively large degree. However, the embodiment described hereinbefore causes a circular motion that gains a distance the center C of wafer W moves in the treating solution while reducing movement in the vertical direction. Thus, the described embodiment provides an advantage of moving the center C of wafer W an increased distance without vertically enlarging the treating tank 1, thereby promoting uniformity.

This invention is not limited to the above embodiment, but may be modified as follows:

(1) The embodiment described above shows, by way of example, the drive mechanism 41 having the first and second rotary shafts 57 and 67 and gears 61 and 69 arranged above the treating tank 5. This invention is not limited to the drive mechanism of such construction. For example, the drive mechanism 41 may be disposed in the bottom of the treating tank for providing drive for revolution from below.

(2) The above embodiment shows the holding mechanism 29 including the holding frames 33 and engaging members 37. This invention is not limited to such construction. For example, substrates may be placed on upper edges of holding members L-shaped as seen from a side, and may be revolved with the holding members in the treating tank.

(3) In the above embodiment, the solution of potassium hydroxide has been cited as an example of treating solution, and the back grinding as an example of treatment. This invention is applicable also to oxide film etching treatment with a solution of hydrofluoric acid, and aluminum etching treatment with phosphoric acid, for example.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates as immersed in a treating solution, comprising:
    a treating tank for storing the treating solution and accommodating the substrates;
    a holding mechanism for holding a plurality of substrates in upstanding posture in said treating tank; and
    a drive mechanism for revolving said holding mechanism about a virtual horizontal axis extending in a direction of alignment of the plurality of substrates;
    wherein said drive mechanism includes:
    a plurality of rotary shafts disposed above said treating tank and extending along the direction of alignment of the plurality of substrates;
    a plurality of gears mounted on said rotary shafts and meshed with each other;
    a rotating mechanism for rotating one of said rotary shafts;
    pivot pieces arranged on one of said rotary shafts and extending from said one of said rotary shafts; and
    connecting pieces each having one end thereof pivotably attached to a distal end of one of said pivot pieces, and having the other end attached to said holding mechanism; and
    wherein the plurality of substrates are treated, while said holding mechanism holding the plurality of substrates is immersed in the treating solution, and said drive mechanism is operated to revolve the plurality of substrates about said horizontal axis.

2. A substrate treating apparatus for treating substrates as immersed in a treating solution, comprising:
    a treating tank for storing the treating solution and accommodating the substrates;
    a holding mechanism for holding a plurality of substrates in upstanding posture in said treating tank; and
    a drive mechanism for revolving said holding mechanism about a virtual horizontal axis extending in a direction of alignment of the plurality of substrates, and at a predetermined distance from the virtual horizontal axis;
    wherein said drive mechanism includes:
    a plurality of rotary shafts disposed above said treating tank and extending along the direction of alignment of the plurality of substrates;
    a plurality of gears mounted on said rotary shafts and meshed with each other;
    a rotating mechanism for rotating one of said rotary shafts;
    pivot pieces arranged on one of said rotary shafts and extending from said one of said rotary shafts; and
    connecting pieces each having one end thereof pivotably attached to a distal end of one of said pivot pieces, and having the other end attached to said holding mechanism; and
    wherein the plurality of substrates are treated, while said holding mechanism holding the plurality of substrates is immersed in the treating solution, and said drive mechanism is operated to revolve centers of the plurality of substrates about said horizontal axis.

3. An apparatus as defined in claim 1, further comprising a lift mechanism for vertically moving said drive mechanism relative to said treating tank.

4. An apparatus as defined in claim 2, further comprising a lift mechanism for vertically moving said drive mechanism relative to said treating tank.

5. An apparatus as defined in claim 1, wherein said treating tank stores the treating solution containing potassium hydroxide.

6. An apparatus as defined in claim 2, wherein said treating tank stores the treating solution containing potassium hydroxide.

7. An apparatus as defined in claim 1, wherein the plurality of substrates immersed in the treating solution stored in said treating tank each have a surface on which a circuit is formed, which surface is coated with a material resistant to the treating solution.

8. An apparatus as defined in claim 2, wherein the plurality of substrates immersed in the treating solution stored in said treating tank each have a surface on which a circuit is formed, which surface is coated with a material resistant to the treating solution.

* * * * *

UNITED STATES PATENT AND TRADEMARK OFFICE
CERTIFICATE OF CORRECTION

PATENT NO. : 7,160,416 B2  Page 1 of 1
APPLICATION NO. : 11/081139
DATED : March 5, 2007
INVENTOR(S) : Koji Hasegawa et al.

It is certified that error appears in the above-identified patent and that said Letters Patent is hereby corrected as shown below:

On Title Page

Item (75) Inventors please delete inventors and replace with

Koji Hasegawa, Kyoto (JP)

Akira Morita, Kyoto (JP)

Kenichiro Arai, Kyoto (JP)

Signed and Sealed this

First Day of May, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,160,416 B2 | |
| APPLICATION NO. | : 11/081139 | |
| DATED | : January 9, 2007 | |
| INVENTOR(S) | : Koji Hasegawa et al. | |

It is certified that error appears in the above-identified patent and that said Letters Patent is hereby corrected as shown below:

On Title Page

Item (75) Inventors please delete inventors and replace with

Koji Hasegawa, Kyoto (JP)

Akira Morita, Kyoto (JP)

Kenichiro Arai, Kyoto (JP)

This certificate supersedes Certificate of Correction issued May 1, 2007.

Signed and Sealed this

Twenty-second Day of May, 2007

JON W. DUDAS
*Director of the United States Patent and Trademark Office*